(12) United States Patent
Zhang et al.

(10) Patent No.: US 9,075,261 B2
(45) Date of Patent: Jul. 7, 2015

(54) CHIP HEAT DISSIPATION STRUCTURE AND LIQUID CRYSTAL DISPLAY HAVING THEREOF

(75) Inventors: Yanxue Zhang, Shenzhen (CN); Yu-Chun Hsiao, Shenzhen (CN)

(73) Assignee: SHENZHEN CHINA STAR OPTOELECTRONICS TECHNOLOGY CO LTD, Shenzhen (CN)

( * ) Notice: Subject to any disclaimer, the term of this patent is extended or adjusted under 35 U.S.C. 154(b) by 0 days.

(21) Appl. No.: 13/637,024

(22) PCT Filed: Jul. 4, 2012

(86) PCT No.: PCT/CN2012/078185
§ 371 (c)(1),
(2), (4) Date: Sep. 25, 2012

(87) PCT Pub. No.: WO2014/000318
PCT Pub. Date: Jan. 3, 2014

(65) Prior Publication Data
US 2015/0103303 A1    Apr. 16, 2015

(30) Foreign Application Priority Data
Jun. 28, 2012  (CN) .......................... 2012 1 0218303

(51) Int. Cl.
*G02F 1/1333*   (2006.01)
*H05K 7/20*     (2006.01)
*H05K 1/02*     (2006.01)

(52) U.S. Cl.
CPC ...... *G02F 1/133382* (2013.01); *H05K 7/20963* (2013.01); *H05K 1/0203* (2013.01); *H05K 7/2039* (2013.01); *H05K 2201/10136* (2013.01)

(58) Field of Classification Search
CPC ................ H01L 2924/12041; H01L 21/4882; H01L 23/36; H01L 23/427; H01L 23/373; G02F 1/133308; G02F 1/133615; G02F 1/133603; G02F 1/1333; G02F 1/133608; G02F 1/133382; G02F 2001/133317; G02F 2001/133314; G02F 2001/13332; G02F 2001/133628; G02F 2201/46; G02F 2203/60; G02B 6/0085; G02B 6/009; G02B 6/0073; H04N 5/2252; F21Y 2101/02; F21Y 2103/003; F21Y 2113/005; H05K 7/20409; H05K 7/20436; H05K 7/2039; H05K 1/0215; H05K 1/141; H05K 1/028; H05K 1/189; H05K 1/0204; H05K 1/142; H05K 2201/10106; H05K 2001/09054; H05K 9/0007; H05K 9/0047; H05K 3/0061; H05K 3/323; G06F 1/20; F21V 29/004; F21V 29/22; F21V 29/2206
USPC ............ 257/88, 99, 783; 349/58, 65, 43, 122; 362/611, 612, 97.1, 218, 294, 311.02, 362/631, 634, 84, 97.3; 348/790, 794, 373; 348/836; 165/185; 361/749, 679.47, 361/679.54, 709, 720, 722, 724, 760, 809; 156/325
See application file for complete search history.

(56) References Cited

U.S. PATENT DOCUMENTS

| | | | | |
|---|---|---|---|---|
| 7,064,952 B1 * | 6/2006 | Chen et al. | ............... | 361/679.01 |
| 7,578,610 B2 * | 8/2009 | Sakamoto et al. | ............ | 362/634 |
| 8,687,142 B2 * | 4/2014 | Lee et al. | ......................... | 349/61 |
| 2008/0018626 A1 * | 1/2008 | Yang et al. | ..................... | 345/204 |

* cited by examiner

*Primary Examiner* — Thoi Duong
(74) *Attorney, Agent, or Firm* — Mark M. Friedman

(57) ABSTRACT

A chip heat dissipation structure and a liquid crystal display having thereof are provided. The chip heat dissipation structure includes a metal heat dissipation member contacted with a chip. The metal heat dissipation member is connected to a metal protection cover of a printed circuit board. The metal heat dissipation member is perpendicular to the metal protection cover. The present invention also relates to a liquid crystal display. The chip heat dissipation structure and a liquid crystal display having thereof of the present invention have a good heat dissipation effect.

13 Claims, 5 Drawing Sheets

CHIP HEAT DISSIPATION STRUCTURE AND LIQUID CRYSTAL DISPLAY HAVING THEREOF

BACKGROUND OF THE INVENTION

1. Field of the Invention

The present invention relates to a heat dissipation design field, and more particularly to a chip heat dissipation structure and a liquid crystal display having thereof.

2. Description of the Prior Art

With the development of science and technology, more and more people begin to enjoy the convenience of a liquid crystal display. The prior liquid crystal display disposes a chip heat dissipation structure to dissipate the heat of the chip, thereby ensuring the normal work of the chip. FIG. 1 is a schematic view of the chip heat dissipation structure, which is formed by bending a metal front frame 1. Namely, the heat dissipation structure and the metal front frame 1 are integrated, wherein a direction X is a display direction of the liquid crystal display. The heat dissipation structure can employ the protrusion design to closely contact with the chip, thereby obtaining the rapid heat dissipation effect of the chip.

But with the development of the liquid crystal display toward the light and thin direction, the front frame of the liquid crystal display gradually begins to adopt PC (Polycarbonate) or ABS (Acrylonitrile-butadiene-styrene) and other plastic materials, so that the heat conduction and the heat dissipation effects of the front frame are poor, and the chip can not be efficiently and rapidly cooled.

Hence, it is necessary to provide a chip heat dissipation structure and a liquid crystal display having thereof, for solving the problems existed in the prior art.

BRIEF SUMMARY OF THE INVENTION

One object of the present invention is to provide a chip heat dissipation structure having a good heat dissipation effect and a liquid crystal display having the chip heat dissipation structure, to solve the technical problems of the heat dissipation structure and the liquid crystal display having a bad heat dissipation effect or having a high manufacture cost in the prior art.

For solving above problems, the present invention provides a technical solution as follows.

The present invention relates to a chip heat dissipation structure, which is disposed in a liquid crystal display, wherein the chip heat dissipation structure comprises:

a metal heat dissipation member, being closely adjacent to a chip in the liquid crystal display and contacting with the chip, the metal heat dissipation member being connected to a metal protection cover of a printed circuit board in the liquid crystal display, and the metal heat dissipation member being perpendicular to the metal protection cover;

the metal heat dissipation member being formed by bending the metal protection cover of the printed circuit board;

the metal heat dissipation member including at least one protrusion, the protrusion protruding toward the chip, and the protrusion forming a face contact with the chip.

In the chip heat dissipation structure of the present invention, the chip heat dissipation structure further comprises a heat dissipation adhesive film disposed on an inner surface of the metal heat dissipation member facing the chip, and the heat dissipation adhesive film forms a face contact with the chip.

In the chip heat dissipation structure of the present invention, a connecting location of the metal heat dissipation member and the metal protection cover disposes at least one strengthening structure thereon.

The present invention also relates to a chip heat dissipation structure, which is disposed in a liquid crystal display, wherein the chip heat dissipation structure comprises:

a metal heat dissipation member, being closely adjacent to a chip in the liquid crystal display and contacting with the chip, the metal heat dissipation member being connected to a metal protection cover of a printed circuit board in the liquid crystal display, and the metal heat dissipation member being perpendicular to the metal protection cover.

In the chip heat dissipation structure of the present invention, the metal heat dissipation member is formed by bending the metal protection cover of the printed circuit board.

In the chip heat dissipation structure of the present invention, the metal heat dissipation member includes at least one protrusion, the protrusion protrudes toward the chip, and the protrusion forms a face contact with the chip.

In the chip heat dissipation structure of the present invention, the chip heat dissipation structure further comprises a heat dissipation adhesive film disposed on an inner surface of the metal heat dissipation member facing the chip, and the heat dissipation adhesive film forms a face contact with the chip.

In the chip heat dissipation structure of the present invention, a connecting location of the metal heat dissipation member and the metal protection cover disposes at least one strengthening structure thereon.

The present invention further relates to a liquid crystal display, which comprises:

a liquid crystal panel;

a chip, being used to drive the liquid crystal panel for displaying an image;

a printed circuit board, being used to arrange a driving circuit of the liquid crystal panel, and disposing a metal protection cover thereon to protect the printed circuit board; and a metal heat dissipation member, being closely adjacent to the chip and contacting with the chip;

the metal heat dissipation member being connected to the metal protection cover, and the metal heat dissipation member being perpendicular to the metal protection cover.

In the liquid crystal display of the present invention, the liquid crystal display further comprises a plastic front frame around a peripheral surface thereof.

In the liquid crystal display of the present invention, the metal heat dissipation member is formed by bending the metal protection cover of the printed circuit board.

In the liquid crystal display of the present invention, the metal heat dissipation member includes at least one protrusion, the protrusion protrudes toward the chip, and the protrusion forms a face contact with the chip.

In the liquid crystal display of the present invention, the chip heat dissipation structure further comprises a heat dissipation adhesive film disposed on an inner surface of the metal heat dissipation member facing the chip, and the heat dissipation adhesive film forms a face contact with the chip.

In the liquid crystal display of the present invention, a connecting location of the metal heat dissipation member and the metal protection cover disposes at least one strengthening structure thereon.

Comparing with the prior art, the chip heat dissipation structure and the liquid crystal display of the present invention have a good heat dissipation effect, and solve the technical problems of a bad heat dissipation effect or a high manufacture cost of the heat dissipation structure and the liquid crystal display of the prior art.

For more clearly and easily understanding above content of the present invention, the following text will take a preferred embodiment with reference to the accompanying drawings for detail description as follows.

DETAILED DESCRIPTION OF THE PREFERRED EMBODIMENTS

Figure 1:
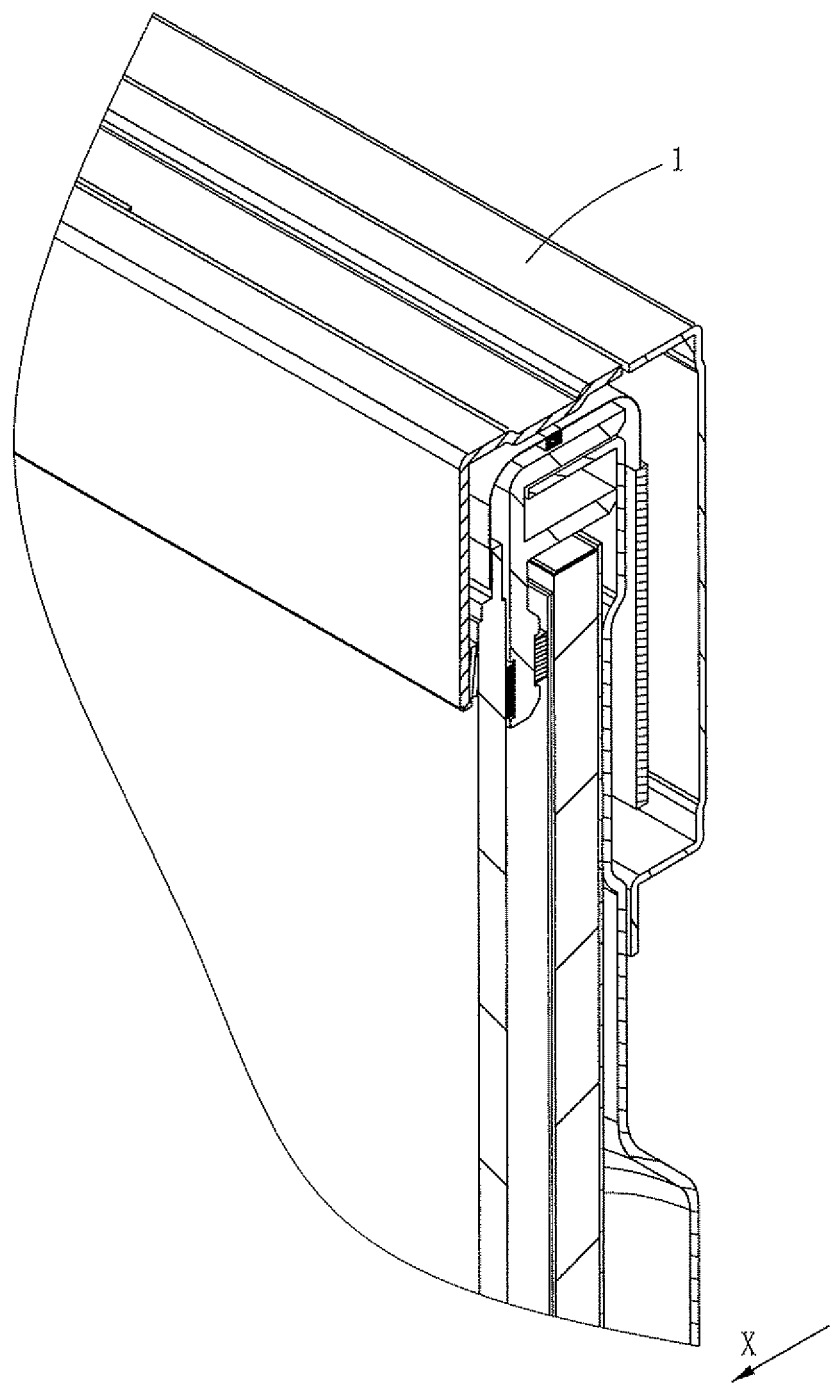
FIG. 1 is a structure schematic view of a chip heat dissipation structure of the prior art.

The following description of every embodiment with reference to the accompanying drawings is used to exemplify a specific embodiment, which may be carried out in the present invention. Directional terms mentioned in the present invention, such as "top", "bottom", "front", "back", "left", "right", "inside", "outside", "side" etc., are only used with reference to the orientation of the accompanying drawings. Therefore, the used directional terms are intended to illustrate, but not to limit, the present invention.

In the drawings, the components having similar structures are denoted by the same numerals.

Figure 2:
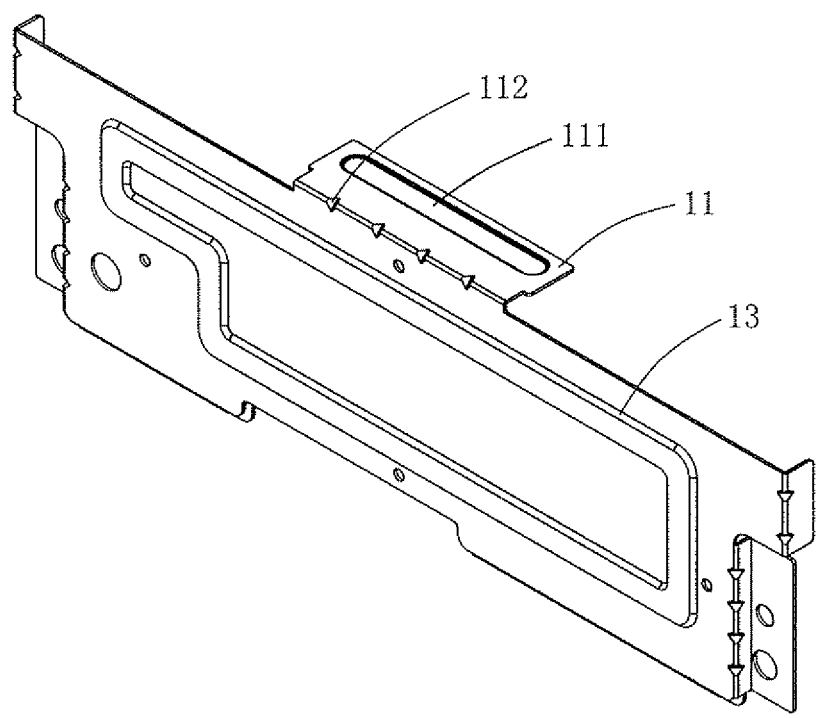
FIG. 2 is a structure schematic view of a first preferred embodiment of a metal heat dissipation member of a chip heat dissipation structure of the present invention.
Figure 3:
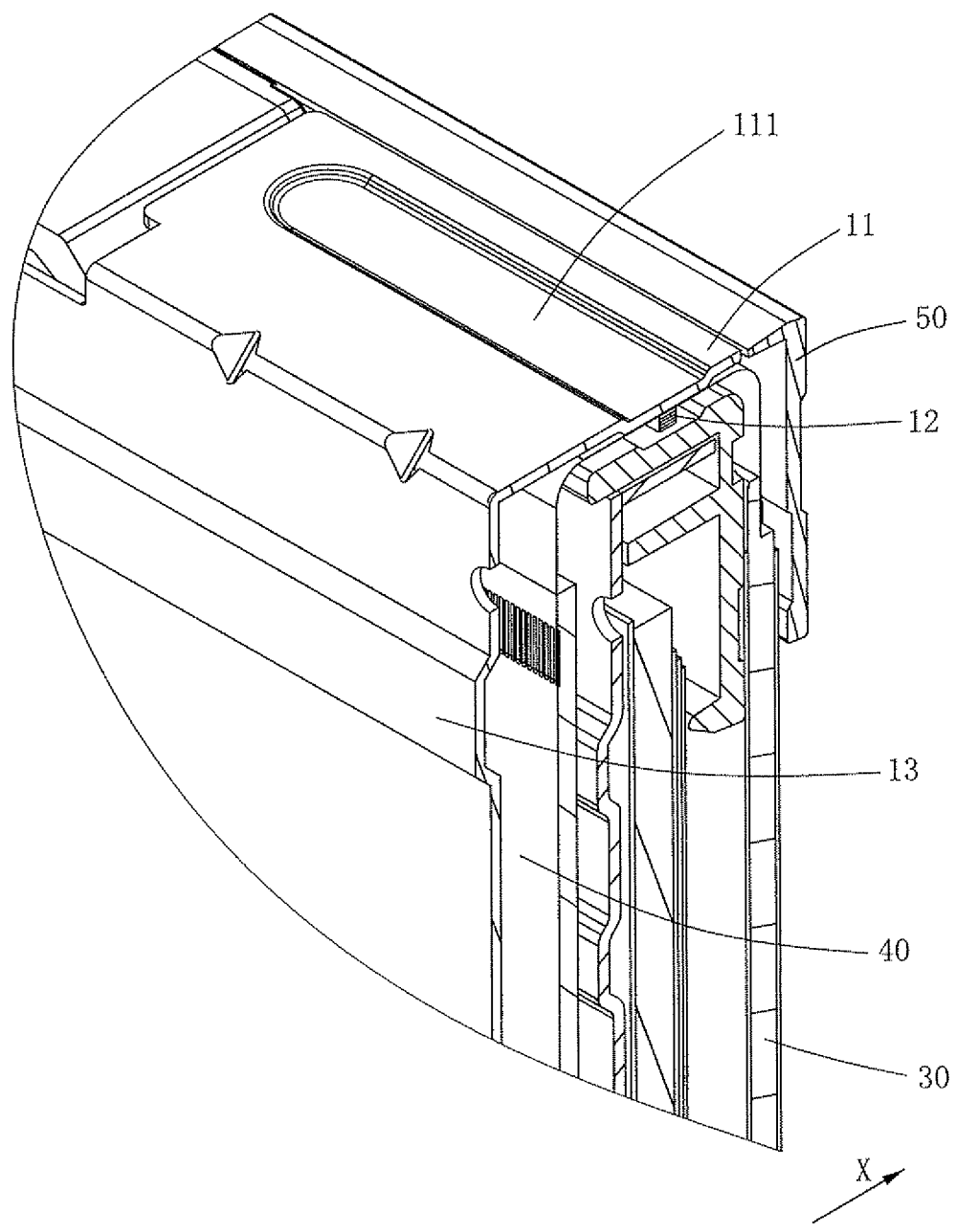
FIG. 3 is a partial section schematic view of a first preferred embodiment of a liquid crystal display of the present invention, wherein mainly showing the first preferred embodiment of the chip heat dissipation structure.

Please refer to FIGS. 2 and 3, FIG. 2 is a structure schematic view of a first preferred embodiment of a metal heat dissipation member of a chip heat dissipation structure of the present invention, and FIG. 3 is a partial section schematic view of a first preferred embodiment of a liquid crystal display of the present invention, wherein mainly showing the first preferred embodiment of the chip heat dissipation structure. A direction denoted by X is a display direction of the liquid crystal display. The chip heat dissipation structure is disposed in the liquid crystal display. The chip heat dissipation structure includes at least one metal heat dissipation member 11. The metal heat dissipation member 11 is closely adjacent to one chip 12 in the liquid crystal display, and can contact with the chip 12, thereby dissipating the heat of the chip 12. The metal heat dissipation member 11 is connected to a metal protection cover (cover) 13 to timely conduct the heat generated by the chip 12 unto the metal protection cover 13. The metal heat dissipation member 11 is perpendicular to the metal protection cover 13. In this embodiment, the metal protection cover 13 is mainly used to protect or load a printed circuit board in the liquid crystal display. In this embodiment, the connection way of the metal heat dissipation member 11 and the metal protection cover 13 is in an integrated structure. Namely, the metal heat dissipation member 11 is formed by vertically bending the metal protection cover 13. However, it can be predicted that, in other embodiment, the metal heat dissipation member 11 and the metal protection cover 13 also can be connected by adopting the welding or other mechanical means. Namely, the metal heat dissipation member 11 can be used as an independent component to be connected to the metal protection cover 13.

In this embodiment, the metal heat dissipation member 11 includes at least one protrusion 111. The protrusion 111 protrudes out of a plane of the metal heat dissipation member 11, and protrudes toward the chip 12, thereby realizing a face contact of the protrusion 111 and the chip 12 to ensure the best heat dissipation effect. Moreover, a connecting location of the metal heat dissipation member 11 and the metal protection cover 13 disposes multiple strengthening structures 112 thereon for ensuring the connection strength of the metal heat dissipation member 11 and the metal protection cover 13, so the metal heat dissipation member 11 is not easy to be deformed.

For the chip heat dissipation structure of the present invention, because the protrusion 111 of the metal heat dissipation member 11 and the chip 12 form a good face contact therebetween, the heat generated by the chip 12 can be timely conducted by the metal protection cover 13 of the printed circuit board, thereby obtaining a good heat dissipation effect. Meanwhile, a front frame of the liquid crystal display may adopt PC or ABS and other plastic materials, and it can not affect the heat dissipation of the chip 12, thereby realizing the light and thin of the liquid crystal display.

Figure 4:
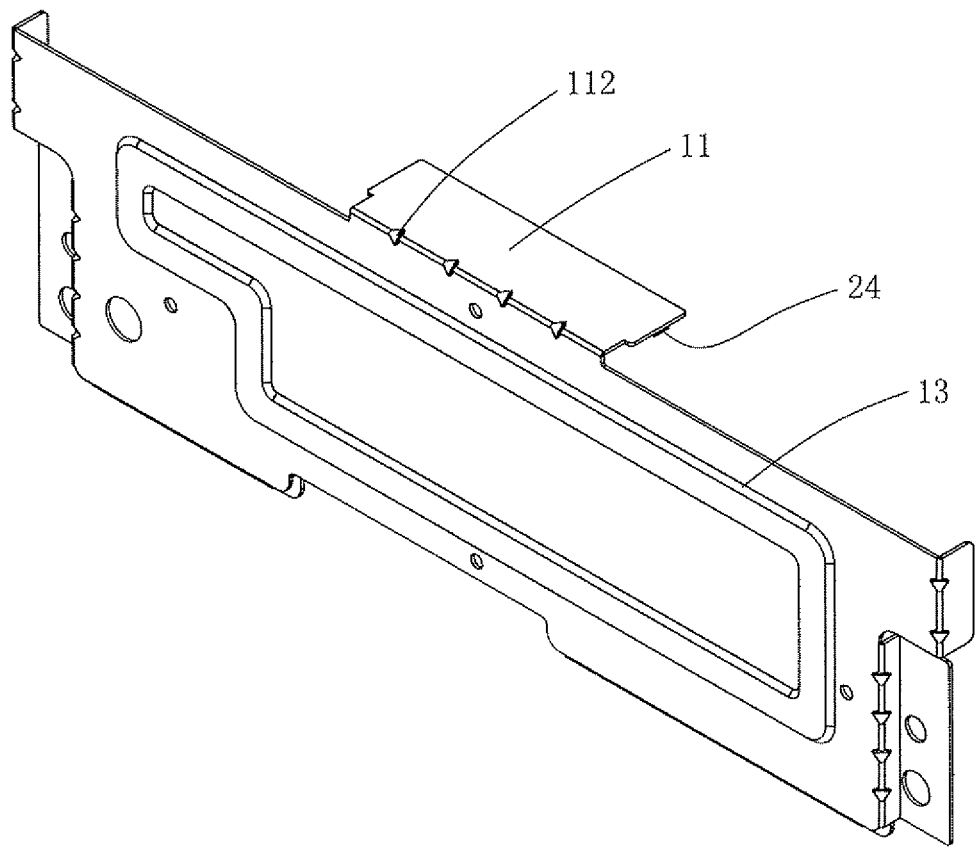
FIG. 4 is a structure schematic view of a second preferred embodiment of the metal heat dissipation member of the chip heat dissipation structure of the present invention.
Figure 5:
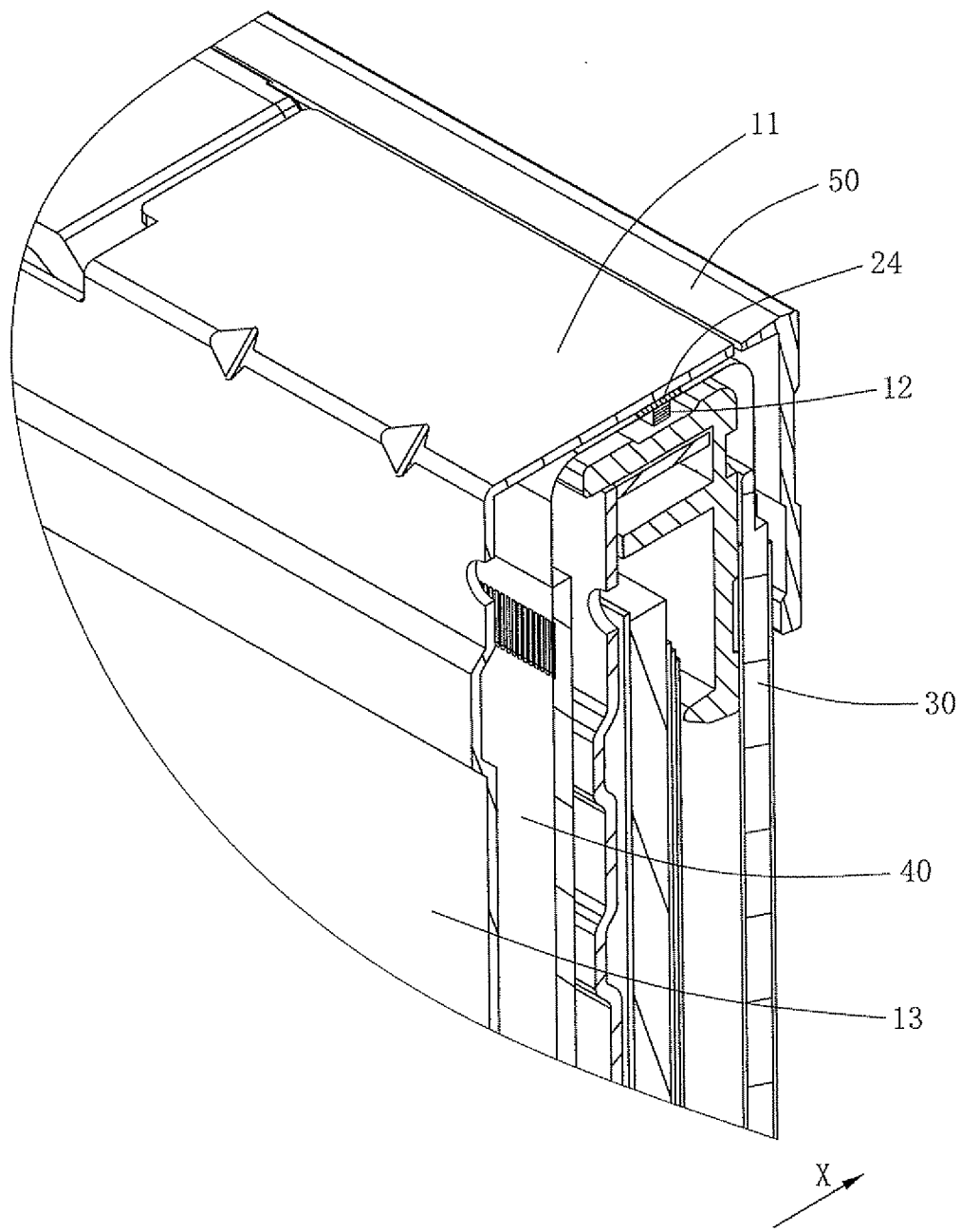
FIG. 5 is a partial section schematic view of the second preferred embodiment of the liquid crystal display of the present invention, wherein mainly showing the second preferred embodiment of the chip heat dissipation structure.

Please refer to FIGS. 4 and 5, FIG. 4 is a structure schematic view of a second preferred embodiment of the metal heat dissipation member of the chip heat dissipation structure of the present invention, and FIG. 5 is a partial section schematic view of the second preferred embodiment of the liquid crystal display of the present invention, wherein mainly showing the second preferred embodiment of the chip heat dissipation structure. The similar components of this embodiment and shown in FIGS. 2 and 3 adopts the same reference numerals. For example, the direction denoted by X in FIGS. 4 and 5 is a display direction of the liquid crystal display. The difference between the second preferred embodiment and the first preferred embodiment is that: the metal heat dissipation member 11 of the second preferred embodiment does not dispose the protrusion 111 shown as FIGS. 2 and 3, but disposes a heat dissipation adhesive film 24 on an inner surface of the metal heat dissipation member 11 facing the chip 12. The heat dissipation adhesive film 24 protrudes toward the chip 12 to realize a face contact of the heat dissipation adhesive film 24 and the chip 12 and ensure a best heat dissipation effect. Moreover, there disposes multiple strengthening structures 112 on the connection location of the metal heat dissipation member 11 and the metal protection cover 13 to ensure the connection strength of the metal heat dissipation member 11 and the metal protection cover 13, so the metal heat dissipation member 11 is not easy to be deformed.

For the chip heat dissipation structure of the present invention, because the heat dissipation adhesive 24 and the chip 12 form a good face contact therebetween, the heat generated by the chip 12 can be timely conducted by the metal protection cover 13 of the printed circuit board, thereby obtaining a good heat dissipation effect. Meanwhile, a front frame of the liquid crystal display may adopt PC or ABS and other plastic materials, and it can not affect the heat dissipation of the chip 12, thereby realizing the light and thin of the liquid crystal display.

The present invention also relates to a liquid crystal display as shown in FIGS. 3 and 5, which adopts above chip heat dissipation structure. Specifically, the liquid crystal display comprises a liquid crystal panel 30, a chip 12, a printed circuit board 40, a metal heat dissipation member 11 and a plastic front frame 50. The chip 12 is used to drive the liquid crystal panel 30 for displaying an image. The printed circuit board 40 is used to arrange a driving circuit of the liquid crystal panel 30, and disposes a metal protection cover 13 thereon to protect the printed circuit board 40. The metal heat dissipation member 11 is closely adjacent to the chip 12 and forms a face contact with the chip, thereby dissipating the heat of the chip 12. The plastic front frame 50 is disposed around a peripheral surface of the liquid crystal display. The metal heat dissipation member 11 is connected to the metal protection cover 13 of the printed circuit board 40 for timely conducting the heat generated by the chip 12 unto the metal protection cover 13. The metal heat dissipation member 11 is perpendicular to the metal protection cover 13. The metal heat dissipation member 11 can either be an independent component being connected to the metal protection cover 13 by the welding or other means, or be formed by directly bending the metal protection cover 13 of the printed circuit board 40.

In the first preferred embodiment of the liquid crystal display of the present invention, the metal heat dissipation member 11 includes at least one protrusion 111, as shown in FIG. 3. The protrusion 111 protrudes out of a plane of the metal heat dissipation member 11 toward the chip 12, for realizing a face contact of the protrusion 111 and the chip 12, and ensuring the best heat dissipation effect.

In the second preferred embodiment of the liquid crystal display of the present invention, as shown in FIG. 5, there disposes the heat dissipation adhesive film 24 on the inner surface of the metal heat dissipation member 11 facing the chip 12. The heat dissipation adhesive film 24 protrudes toward the chip 12, for realizing a face contact of the heat dissipation adhesive film 24 and the chip 12, and ensuring the best heat dissipation effect.

Of course, the metal heat dissipation member 11 may simultaneously dispose the protrusion 111 and the heat dissipation adhesive film 24 on the inner surface thereof, thereby making the heat dissipation effect be maximized.

Moreover, there disposes multiple strengthening structures 112 on the connection location of the metal heat dissipation member 11 and the metal protection cover 13 to ensure the connection strength of the metal heat dissipation member 11 and the metal protection cover 13, so the metal heat dissipation member 11 is not easy to be deformed.

The specific implementation mode and the beneficial effects of the liquid crystal display of the present invention is the same as or similar to that described above for the chip heat dissipation structure. For the detailed description, please refer to the specific embodiment of above chip heat dissipation structure.

The chip heat dissipation structure and the liquid crystal display having thereof in the present invention have a simple structure and a good heat dissipation effect, and solve the technical problems of a bad heat dissipation effect or a high manufacture cost of the heat dissipation structure and the liquid crystal display of the prior art.

In conclusion, although the present invention has been disclosed by above preferred embodiments, above preferred embodiments are not used to limit the present invention. One of ordinary skills in the art also can make all sorts of improvements and amendments within the principles of the present invention. Therefore, the protection scope of the present invention should be based on the scope defined by the appended claims.

What is claimed is:

1. A chip heat dissipation structure, which is disposed in a liquid crystal display, wherein the chip heat dissipation structure comprising:

a metal beat dissipation member, being closely adjacent to a chip in the liquid crystal display and contacting with the chip, the metal heat dissipation member being connected to a metal protection cover of a printed circuit board in the liquid crystal display, a connecting location of the metal heat dissipation member and the metal protection cover disposing at least one strengthening structure thereon, and the metal heat dissipation member being perpendicular to the metal protection cover;

the metal heat dissipation member being formed by bending the metal protection cover of the printed circuit board;

the metal heat dissipation member including at least one protrusion, the protrusion protruding toward the chip, and the protrusion forming a face contact with the chip.

2. The chip heat dissipation structure as claimed in claim 1, wherein the chip heat dissipation structure further comprises a heat dissipation adhesive film disposed on an inner surface of the metal heat dissipation member facing the chip, and the heat dissipation adhesive film forms a face contact with the chip.

3. A chip heat dissipation structure, which is disposed in a liquid crystal display, wherein the chip heat dissipation structure comprising:

a metal heat dissipation member, being closely adjacent to a chip in the liquid crystal display and contacting with the chip, the metal heat dissipation member being connected to a metal protection cover of a printed circuit board in the liquid crystal display, a connecting location of the metal heat dissipation member and the metal protection cover disposing at least one strengthening structure thereon, and the metal heat dissipation member being perpendicular to the metal protection cover.

4. The chip beat dissipation structure as claimed in claim 3, wherein the metal heat dissipation member is formed by bending the metal protection cover of the printed circuit hoard.

5. The chip heat dissipation structure as claimed in claim 3, wherein the metal heat dissipation member includes at least one protrusion, the protrusion protrudes toward the chip, and the protrusion forms a face contact with the chip.

6. The chip heat dissipation structure as claimed in claim 5, wherein the chip heat dissipation structure further comprises a heat dissipation adhesive film disposed on an inner surface of the metal heat dissipation member facing the chip, and the heat dissipation adhesive film forms a face contact with the chip.

7. The chip heat dissipation structure as claimed in claim 3, wherein the chip heat dissipation structure further comprises a heat dissipation adhesive film disposed on an inner surface of the metal heat dissipation member facing the chip, and the heat dissipation adhesive film forms a face contact with the chip.

8. A liquid crystal display, comprising:

a liquid crystal panel;

a chip, being used to drive the liquid crystal panel for displaying an image;

a printed circuit board, being used to arrange a driving circuit of the liquid crystal panel, and disposing a metal protection cover thereon to protect the printed circuit board; and a metal heat dissipation member, being closely adjacent to the chip and contacting with the chip;

the metal heat dissipation member being connected to the metal protection cover, a connecting location of the metal heat dissipation member and the metal protection cover disposing at least one strengthening structure thereon, and the metal heat dissipation member being perpendicular to the metal protection cover.

9. The liquid crystal display as claimed in claim 8, wherein the liquid crystal display further comprises a plastic front frame around a peripheral surface thereof.

10. The liquid crystal display as claimed in claim 8, wherein the metal heat dissipation member is formed by bending the metal protection cover of the printed circuit board.

11. The liquid crystal display as claimed in claim 8, wherein the metal heat dissipation member includes at least one protrusion, the protrusion protrudes toward the chip, and the protrusion forms a face contact with the chip.

12. The liquid crystal display as claimed in claim 11, wherein the chip heat dissipation structure further comprises a heat dissipation adhesive film disposed on an inner surface of the metal heat dissipation member facing the chip, and the heat dissipation adhesive film forms a face contact with the chip.

13. The liquid crystal display as claimed in claim 8, wherein the chip heat dissipation structure further comprises a heat dissipation adhesive film disposed on an inner surface of the metal heat dissipation member facing the chip, and the heat dissipation adhesive film forms a face contact with the chip.

* * * * *

UNITED STATES PATENT AND TRADEMARK OFFICE
CERTIFICATE OF CORRECTION

Page 1 of 1

PATENT NO. : 9,075,261 B2
APPLICATION NO. : 13/637024
DATED : July 7, 2015
INVENTOR(S) : Yanxue Zhang et al.

It is certified that error appears in the above-identified patent and that said Letters Patent is hereby corrected as shown below:

In the claims:

Claim 1 line 1 should be corrected as follows:
Change
-- beat --
to
"heat"

Claim 4 line 34 should be corrected as follows:
Change
-- beat --
to
"heat"

Claim 4 line 37 should be corrected as follows:
Change
-- hoard --
to
"board"

Signed and Sealed this
Seventeenth Day of November, 2015

Michelle K. Lee
*Director of the United States Patent and Trademark Office*